(12) United States Patent
Kawada et al.

(10) Patent No.: US 9,226,419 B2
(45) Date of Patent: Dec. 29, 2015

(54) ELECTRONIC DEVICE

(71) Applicant: Panasonic Corporation, Kadoma-shi, Osaka (JP)

(72) Inventors: Yoshihiro Kawada, Osaka (JP); Kenichi Shindo, Osaka (JP); Ryo Yonezawa, Kyoto (JP); Yoshinari Matsuyama, Osaka (JP); Hirofumi Sasaki, Hyogo (JP); Haruka Kaneko, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 280 days.

(21) Appl. No.: 13/940,605

(22) Filed: Jul. 12, 2013

(65) Prior Publication Data
US 2014/0063700 A1    Mar. 6, 2014

(30) Foreign Application Priority Data
Sep. 4, 2012   (JP) ................. 2012-194466

(51) Int. Cl.
*H05K 5/02* (2006.01)
*G06F 1/16* (2006.01)

(52) U.S. Cl.
CPC ............ *H05K 5/0226* (2013.01); *G06F 1/1616* (2013.01); *G06F 1/1681* (2013.01)

(58) Field of Classification Search
CPC ... G06F 1/1616; G06F 1/1656; G06F 1/1626; G06F 1/166; G06F 1/1613; G06F 1/1681; G06F 1/203; G06F 1/1601; G06F 1/1618; G06F 1/1637; G06F 3/03547; H05K 5/00; H05K 5/0217; H05K 5/0221; H05K 5/0226; H05K 5/0234

USPC ............... 361/679, 679.59, 679.02, 679.21, 361/679.43, 679.58, 752, 807, 809, 679.09, 361/679.27, 679.3, 679.57, 730, 733, 810; 312/223.2
See application file for complete search history.

(56) References Cited

U.S. PATENT DOCUMENTS

| | | | | |
|---|---|---|---|---|
| 6,097,592 A | * | 8/2000 | Seo et al. | 361/679.55 |
| 6,768,637 B1 | * | 7/2004 | Amemiya | 361/679.55 |
| 2009/0237878 A1 | * | 9/2009 | Chen | 361/679.55 |
| 2011/0164377 A1 | * | 7/2011 | Wang | 361/679.55 |
| 2012/0212924 A1 | * | 8/2012 | Nakajima | 361/807 |

FOREIGN PATENT DOCUMENTS

JP    09-148757    6/1997

* cited by examiner

*Primary Examiner* — Hung S Bui
*Assistant Examiner* — Michael Matey
(74) *Attorney, Agent, or Firm* — Hamre, Schumann, Mueller & Larson, P.C.

(57) ABSTRACT

An electronic device 100 includes: a hinge mechanism 120 configured to rotate, on a connection portion in which a first casing 101 is connected to a second casing 102, the second casing 102 to switch the electronic device 100 from a closed position through an opened position to an inverted position, and configured to rotate according to the second casing 102 being rotated when switching between the opened position and the inverted position is performed; and a leg component 140 configured to switch, by rotating with the hinge mechanism 120 when switching between the opened position and the inverted position is performed, between a state where the leg component 140 projects from the back surface of the first casing 101 in the opened position, and a state where the leg component 140 projects from the top surface of the first casing 101 in the inverted position.

34 Claims, 8 Drawing Sheets

ELECTRONIC DEVICE

BACKGROUND

1. Field

The present disclosure relates to electronic devices each having a first casing and a second casing that are connected to each other by a hinge mechanism.

2. Description of the Related Art

Japanese Laid-Open Patent Publication No. 9-148757 discloses an electronic device in which a cover for protecting a body surface can be rotated about a hinge shaft and folded onto the back side of the body.

In this electronic device, a hinge unit is provided between the cover and the body and pivotally supported, through the hinge shaft, by the cover and the body. In the hinge unit, a stand component for tilting the body is accommodated. The stand component can be drawn from the hinge unit.

SUMMARY

The present disclosure is to make available an electronic device that can switch from a closed position where a front surface of a second casing overlaps a top surface of a first casing, through an opened position where the second casing is raised relative to the first casing, to an inverted position where a back surface of the second casing overlaps a back surface of the first casing, and that has a useful leg component.

An electronic device according to the present disclosure includes: a first casing having an operation section on a top surface; a second casing having a display on a front surface; a hinge mechanism configured to connect the first casing to the second casing, the hinge mechanism configured to rotate the second casing, relative to the first casing, on a connection portion in which the first casing is connected to the second casing, to allow the electronic device to switch from a closed position where the front surface of the second casing overlaps the top surface of the first casing, through an opened position where the second casing is raised relative to the first casing, to an inverted position where a back surface of the second casing overlaps a back surface of the first casing, the hinge mechanism configured to rotate according to the second casing being rotated when switching between the opened position and the inverted position is performed; and a leg component configured to act as a leg for the electronic device, to rotate with the hinge mechanism when switching between the opened position and the inverted position is performed, and to switch, by rotating with the hinge mechanism, between a state where the leg component projects from the back surface of the first casing in the opened position, and a state where the leg component projects from the top surface of the first casing in the inverted position.

The present disclosure is to make available an electronic device that can switch from a closed position through an opened position to an inverted position, and that includes a useful leg component.

DETAILED DESCRIPTION

Hereinafter, embodiments will be described in detail with reference to the drawings as appropriate. However, there will be instances in which detailed description beyond what is necessary is omitted. For example, detailed description of subject matter that is previously well-known, as well as redundant description of components that are substantially the same will in some cases be omitted. This is to prevent the following description from being unnecessarily lengthy, in order to facilitate understanding by a person of ordinary skill in the art.

The inventors provide the following description and the accompanying drawings in order to allow a person of ordinary skill in the art to sufficiently understand the present disclosure, and the description and the drawings are not intended to restrict the subject matter of the scope of the patent claims.

Hereinafter, an exemplary embodiment will be described with reference to FIGS. 1 to 16.

[1. Entire Configuration of Electronic Device]

Figure 1:
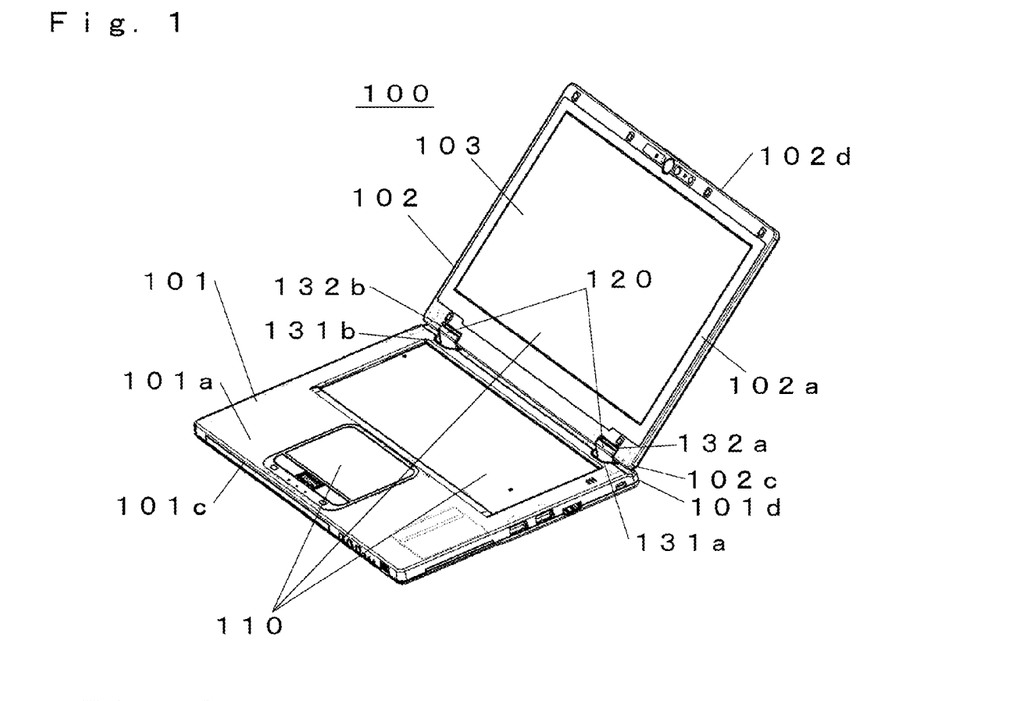
FIG. 1 is a perspective view of an electronic device, in an opened position, according to one embodiment.
Figure 2:
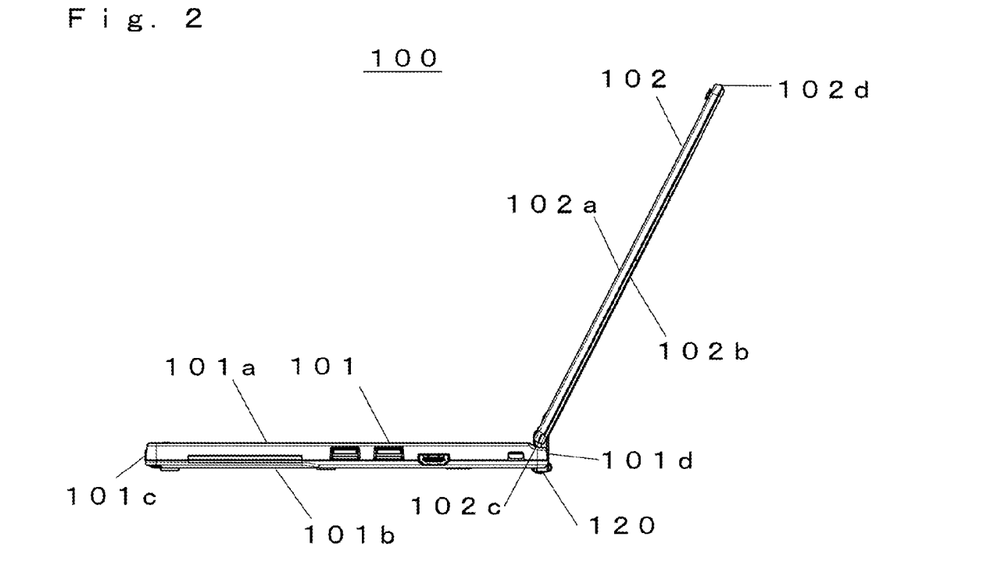
FIG. 2 is a side view of the electronic device, in the opened position, according to the embodiment.
Figure 3:
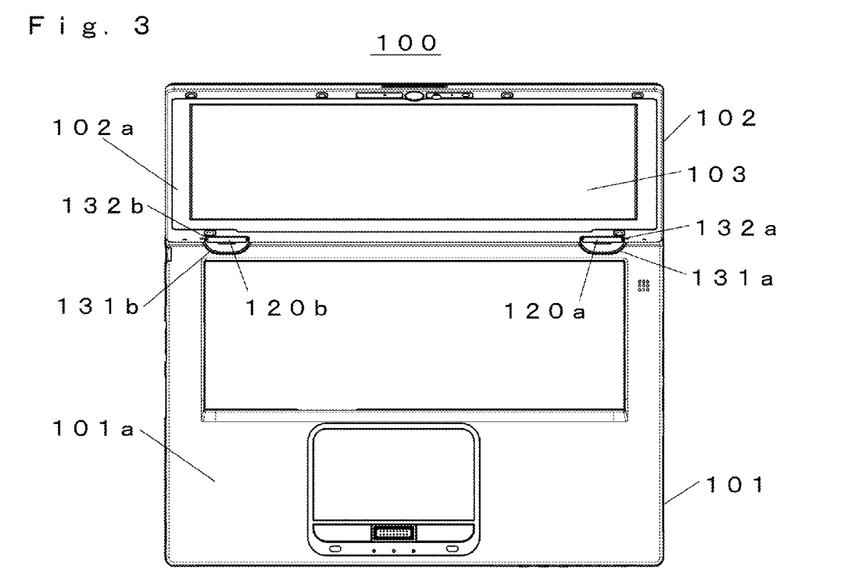
FIG. 3 is a top view of the electronic device, in the opened position, according to the embodiment.
Figure 4:
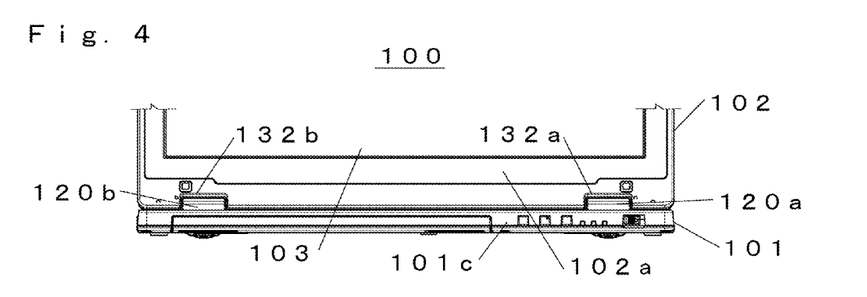
FIG. 4 is a front view illustrating a front side end face of a first casing according to the embodiment.
Figure 5:
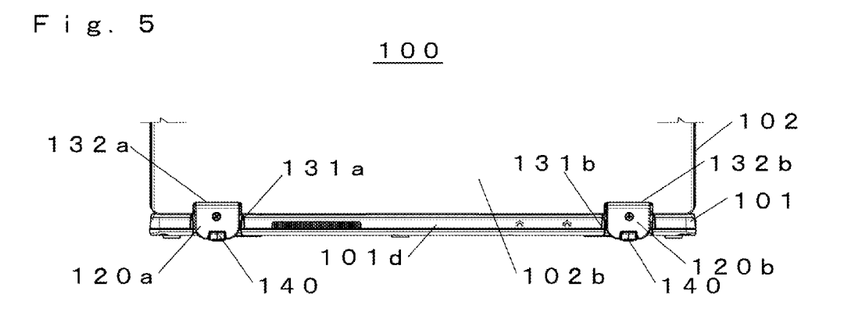
FIG. 5 is a front view illustrating a rear side end face of the first casing according to the embodiment.
Figure 6:
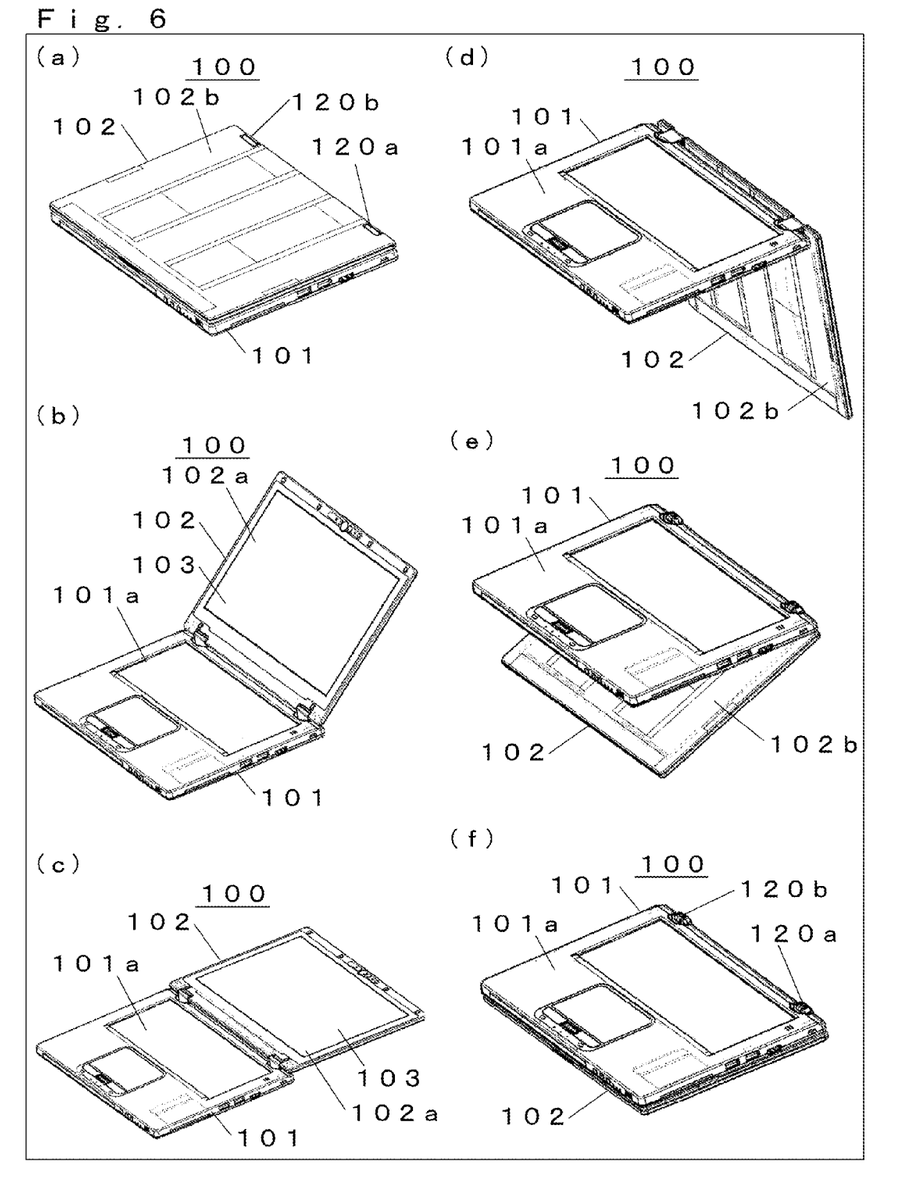
FIG. 6 is a perspective view of the electronic device according to the embodiment in a state where the electronic device is being switched from a closed position through the opened position to an inverted position.

FIG. 1 is a perspective view of an electronic device 100, in an opened position, according to the present embodiment. FIG. 2 is a side view of the electronic device 100, in the opened position, according to the present embodiment. FIG. 3 is a top view of the electronic device 100, in the opened position, according to the present embodiment. FIG. 4 is a front view illustrating a front side end face 101*c* of a first casing 101 according to the present embodiment. FIG. 5 is a front view illustrating a rear side end face 101*d* of the first casing 101 according to the present embodiment. FIG. 6 is a perspective view of the electronic device 100 according to the present embodiment in a state where the electronic device 100 is being switched from a closed position through the opened position to an inverted position.

As shown in FIG. 1, the electronic device 100 of the present embodiment is a notebook computer which is one example of an information processing apparatus. The electronic device 100 includes: the first casing 101 having operation sections 110 provided on a top surface 101*a*; a second casing 102 having a display 103 provided on a front surface 102*a*; a hinge mechanism 120 connecting a rear side portion of the first casing 101 to one of end portions (a lower side portion in FIG. 1) of the second casing 102; and leg components 140 that act as legs for the electronic device 100. The operation sections 110 are sections on which an operation is received from a user of the electronic device 100, and are implemented as, for example, a keyboard, a touch pad, and a touch panel. The touch panel is disposed on the display 103 so as to overlap the display 103. In the following description, the hinge mechanism 120 side of the first casing 101 is referred to as "far side" or "rear side", and a side opposite thereto is referred to as "near side" or "front side".

As shown in FIG. 1 and FIG. 2, the first casing 101 is a thin casing having a roughly rectangular shape as viewed in a planar manner. The first casing 101 has the top surface 101*a*, a back surface 101*b*, the front side end face 101*c*, and the rear side end face 101*d* (far side end face). The first casing 101 has a CPU, a memory, an HDD, a battery, and the like mounted therein (not shown). The keyboard and the touch pad of the operation sections 110 as described above are provided on the top surface 101*a* of the first casing 101. For example, a portion through which the battery is removed is formed on the back surface 101*b* of the first casing 101 (not shown). A connection terminal for an electrical cord, a connection port (for example, a USB port) for a peripheral device, and the like are formed on the outer circumferential surface (a surface extending in the thickness direction of the first casing 101) of the first casing 101 (not shown).

As shown in FIG. 1, in the first casing 101, a first hinge recess 131*a* and a second hinge recess 131*b* are formed in the rear side end face 101*d* so as to be recessed toward the near side of the first casing 101. In the hinge recesses 131*a* and 131*b*, the hinge mechanism 120 is provided. The first hinge recess 131*a* is formed near the far right side corner of the first casing 101 in FIG. 3. The second hinge recess 131*b* is formed near the far left side corner of the first casing 101 in FIG. 3.

Each of the hinge recesses 131*a* and 131*b* has a width, in the left-right direction of the first casing 101, which is greater than a depth in the upward-downward direction (the front-rear direction of the first casing 101) in FIG. 3. When each of the hinge recesses 131*a* and 131*b* is viewed from above the first casing 101, roughly arc-shaped wall surfaces extend toward the far side from both ends, respectively, of a linear bottom surface located on the near side (the lower side in FIG. 3), so as to spread in the width direction (the left-right direction in FIG. 3). The width of each of the hinge recesses 131*a* and 131*b* is reduced toward the front side of the first casing 101.

As shown in FIG. 1 and FIG. 2, the second casing 102 is a thin casing having a roughly rectangular shape as viewed in a planar manner. The second casing 102 has the front surface 102*a*, a back surface 102*b*, a base end face 102*c*, and a top end face 102*d*. The shape and size of the second casing 102 are almost the same as the shape and size of the first casing 101, as viewed in the planar manner. In the second casing 102, the display 103 occupies a large part of the front surface 102*a*. In the second casing 102, the back surface 102*b* opposite to the display 103 is a shield surface for protecting the electronic device 100.

As shown in FIG. 1, in the second casing 102, a first hinge recess 132*a* and a second hinge recess 132*b* are formed in the base end face 102*c* so as to be recessed toward the top end face of the second casing 102. The hinge recesses 132*a* and 132*b* are formed at such positions as to correspond to the hinge recesses 131*a* and 131*b*, respectively, of the first casing 101. In the hinge recesses 132*a* and 132*b*, the hinge mechanism 120 is provided. The first hinge recess 132*a* is formed near the lower right corner of the second casing 102 in FIG. 4. The second hinge recess 132*b* is formed near the lower left corner of the second casing 102 in FIG. 4.

Each of the hinge recesses 132*a* and 132*b* has a width, in the left-right direction of the second casing 102, which is greater than a depth in the upward-downward direction in FIG. 4. When each of the hinge recesses 132*a* and 132*b* is viewed from the front of the second casing 102, linear wall surfaces extend from both ends, respectively, of a linear bottom surface in almost the perpendicularly downward direction. Each of the hinge recesses 132*a* and 132*b* has an almost uniform width in the depth direction. Each of the hinge recesses 132*a* and 132*b* has a width that is almost equal to the width of an opening of each of the hinge recesses 131*a* and 131*b* of the first casing 101.

As shown in FIG. 5, the hinge mechanism 120 includes a first rotation mechanism 120*a* and a second rotation mechanism 120*b* each having a leg component 140 mounted thereto. The first rotation mechanism 120*a* is disposed across the first hinge recess 131*a* of the first casing 101 and the first hinge recess 132*a* of the second casing 102. The first rotation mechanism 120*a* is connected to the first casing 101 in the first hinge recess 131*a* of the first casing 101 so as to be rotatable, and is connected to the second casing 102 in the first hinge recess 132*a* of the second casing 102 so as to be rotatable. On the other hand, the second rotation mechanism 120*b* is disposed across the second hinge recess 131*b* of the first casing 101 and the second hinge recess 132*b* of the second casing 102. The second rotation mechanism 120*b* is connected to the first casing 101 in the second hinge recess 131*b* of the first casing 101 so as to be rotatable, and is connected to the second casing 102 in the second hinge recess 132*b* of the second casing 102 so as to be rotatable. The hinge mechanism 120 and the leg component 140 will be described below in detail.

The hinge mechanism 120 is structured so as to allow the electronic device 100 to switch from a closed position through an opened position to an inverted position by the second casing 102 pivoting on a portion at which the first casing 101 and the second casing 102 are connected to each other. The second casing 102 can pivot on the portion at which the first casing 101 and the second casing 102 are connected to each other, to rotate about 360 degrees by means of the hinge mechanism 120. As shown in FIG. 6(*a*), in the closed position, the electronic device 100 is closed such that the front surface 102*a* of the second casing 102 overlaps the top surface 101*a* of the first casing 101. In the closed position, the display 103 opposes the keyboard of the first casing 101.

When the second casing 102 is rotated from the closed position, the electronic device 100 enters the opened position as shown in FIG. 6(*b*). In the opened position, the electronic device 100 is opened such that the second casing 102 is away from the near side of the first casing 101. In the opened position, a user is allowed to view the display 103 from the near side of the first casing 101. When the second casing 102 is further rotated in the state shown in FIG. 6(*b*), the electronic device 100 enters the opened position as shown in FIG. 6(c) where the front surface 102a of the second casing 102 and the top surface 101a of the first casing 101 face in the same direction. When the second casing 102 is further rotated in the state shown in FIG. 6(c), the electronic device 100 is switched through a position, as shown in FIG. 6(d), where the front surface 102a of the second casing 102 faces rearward, and a position, as shown in FIG. 6(e), where the back surface 102b of the second casing 102 is close to the back surface 101b of the first casing 101, to the inverted position, as shown in FIG. 6(f), where the back surface 102b of the second casing 102 overlaps the back surface 101b of the first casing 101. In the inverted position, a user is allowed to use the electronic device 100 like a tablet. In this case, for example, the user is allowed to use the electronic device 100 in a state where the display 103 faces upward, and the top surface 101a of the first casing faces downward.

When the second casing 102 is rotated in the direction opposite to the direction in which the closed position is switched to the inverted position, the electronic device 100 is returned from the inverted position through the opened position to the closed position. When the position shown in FIG. 6(a) is switched to the position shown in FIG. 6(c), although the second casing 102 rotates, the first rotation mechanism 120a and the second rotation mechanism 120b do not rotate. On the other hand, when the position shown in FIG. 6(c) is switched to the position shown in FIG. 6(f), the first rotation mechanism 120a and the second rotation mechanism 120b each rotate almost 180 degrees about a second rotation shaft 122 described below according to the rotation of the second casing 102.

[2. Structures of Hinge Mechanism and Leg Component]

Figure 7:
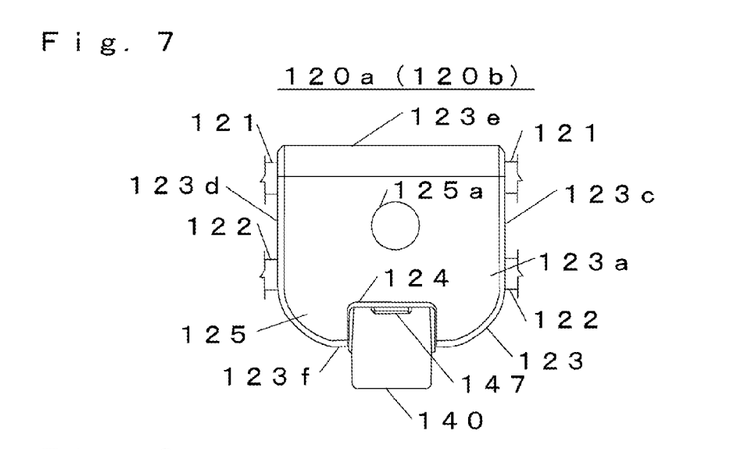
FIG. 7 is a front view of a rotation mechanism according to the embodiment.
Figure 8:
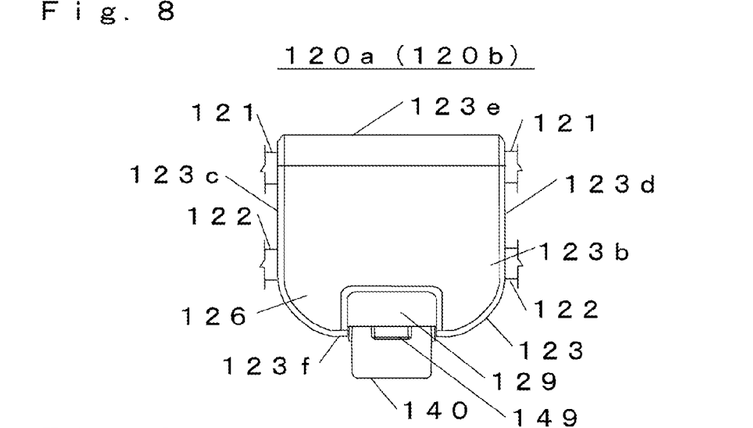
FIG. 8 is a rear view of the rotation mechanism according to the embodiment.
Figure 9:
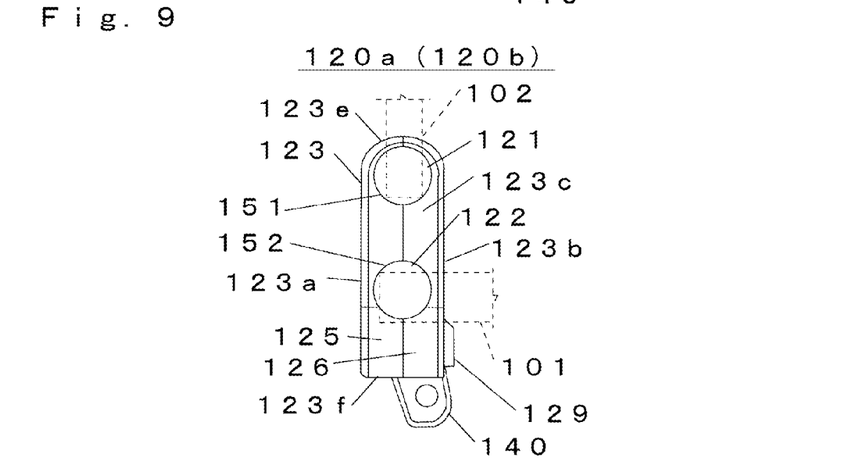
FIG. 9 is a side view of the rotation mechanism according to the embodiment.
Figure 10:
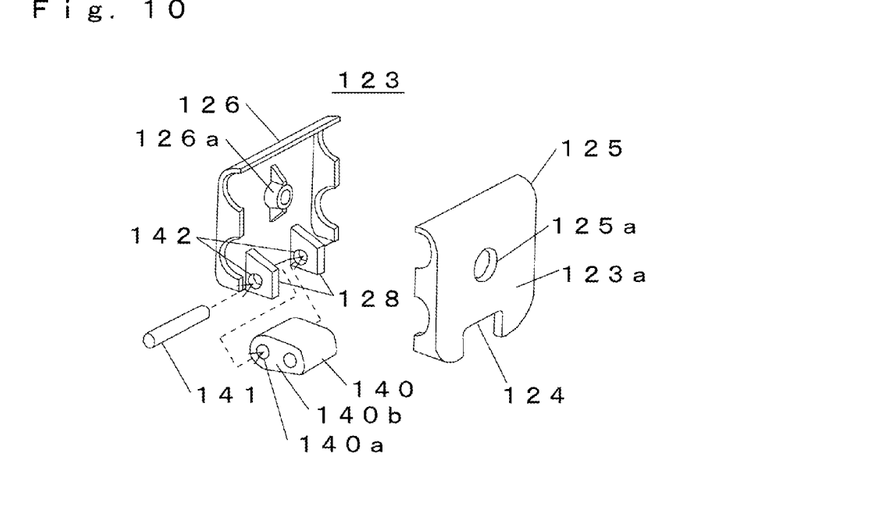
FIG. 10 is an exploded perspective view of a casing of the rotation mechanism according to the embodiment.
Figure 11:
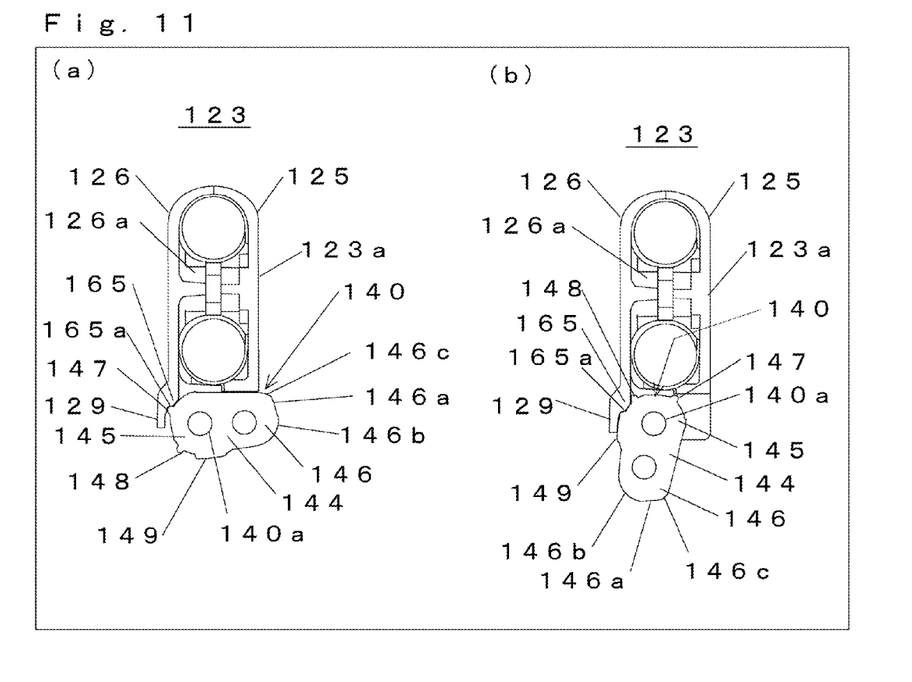
FIG. 11 is a cross-sectional view of the casing and a leg component according to the embodiment.

FIG. 7 is a front view of each of the rotation mechanisms 120a and 120b according to the present embodiment. FIG. 8 is a rear view of each of the rotation mechanisms 120a and 120b according to the present embodiment. FIG. 9 is a side view of each of the rotation mechanisms 120a and 120b according to the present embodiment. FIG. 10 is an exploded perspective view of a casing 123 of each of the rotation mechanisms 120a and 120b according to the present embodiment. FIG. 11 is a cross-sectional view of the casing 123 and the leg component 140 according to the present embodiment. FIG. 11(a) illustrates a short-leg state, and FIG. 11(b) illustrates a long-leg state. For each of the rotation mechanisms 120a and 120b, a side thereof which is exposed in the case of the electronic device 100 being in the closed position and the opened position is referred to as a front surface, and a side opposite thereto is referred to as a rear surface.

Firstly, the hinge mechanism 120 will be described.

The hinge mechanism 120 includes the first rotation mechanism 120a and the second rotation mechanism 120b as described above. The first rotation mechanism 120a and the second rotation mechanism 120b rotate according to the second casing 102 being rotated in the case of the switching between the opened position and the inverted position being performed. The first rotation mechanism 120a and the second rotation mechanism 120b have the same structure. Therefore, in the following description, the first rotation mechanism 120a will be described.

The first rotation mechanism 120a has a first rotation shaft 121, the second rotation shaft 122, and a box-shaped casing 123 (exterior component) as shown in FIG. 7, FIG. 8, and FIG. 9. The first rotation shaft 121 and the second rotation shaft 122 act as rotation shafts for opening and closing operation. The first rotation shaft 121 and the second rotation shaft 122 are each formed in a roughly cylindrical shape.

As shown in FIG. 9, the casing 123 is a box-shaped component having a first principal surface 123a and a second principal surface 123b that are parallel to each other. In the casing 123, a first side surface 123c and a second side surface 123d are also formed so as to be parallel to each other. One end face 123e (the upper surface in FIG. 9) of the casing 123 is formed in a roughly semicircular shape as viewed in cross-section. Further, the other end face 123f of the casing 123 is formed such that portions extending from the side surfaces 123c and 123d, respectively, are roughly arc-shaped so as to be curved inward, as shown in FIG. 7 and FIG. 8. Therefore, in a region of the other end face of the casing 123, the width, in the left-right direction shown in FIG. 7 and FIG. 8, of the casing 123 is reduced toward the other end face. Further, a leg recess 124 is formed in almost the center portion on the other end face side of the casing 123.

The leg recess 124 has a width, in the left-right direction, which is greater than a depth in the upward-downward direction in FIG. 7. When the leg recess 124 is viewed from the front of the casing 123, linear wall surfaces extend from both ends, respectively, of a linear bottom surface in almost the perpendicularly downward direction in FIG. 7. The leg recess 124 has an almost uniform width in the depth direction thereof. The leg recess 124 is open on the front surface side of the casing 123. The leg recess 124 is sectioned, by a sectioning wall 129 described below, on the rear surface side of the casing 123.

As shown in FIG. 9, a first shaft receiver 151 for supporting the first rotation shaft 121 so as to allow the first rotation shaft 121 to be rotatable, and a second shaft receiver 152 for supporting the second rotation shaft 122 so as to allow the second rotation shaft 122 to be rotatable, are provided in the casing 123. The first shaft receiver 151 is formed as circular through holes formed, on one end side (the upper side portion in FIG. 9) of the casing 123, in the first side surface 123c and the second side surface 123d. The second shaft receiver 152 is formed as circular through holes formed, on the other end side (the lower side portion in FIG. 9) of the casing 123, in the first side surface 123c and the second side surface 123d.

The first rotation shaft 121 is inserted into the first shaft receiver 151 (the through holes) formed in the first side surface 123c and the second side surface 123d, and projects from the first side surface 123c and the second side surface 123d. The first rotation shaft 121 of the first rotation mechanism 120a is fixed to the second casing 102 in the first hinge recess 132a of the second casing 102. The first rotation shaft 121 of the second rotation mechanism 120b is fixed to the second casing 102 in the second hinge recess 132b of the second casing 102.

The second rotation shaft 122 is inserted into the second shaft receiver 152 (the through holes) formed in the first side surface 123c and the second side surface 123d, and project from the first side surface 123c and the second side surface 123d. The second rotation shaft 122 of the first rotation mechanism 120a is fixed to the first casing 101 in the first hinge recess 131a of the first casing 101. The second rotation shaft 122 of the second rotation mechanism 120b is fixed to the first casing 101 in the second hinge recess 131b of the first casing 101.

The casing 123 is formed by a plurality of components (in the present embodiment, two components of a first component 125 and a second component 126) being assembled, as shown in FIG. 10. The first component 125 and the second component 126 are integrated with each other by a screw being inserted into a screw insertion hole 125a formed in the first component 125 and fitted into a screw fitting portion 126a formed in the second component 126.

The second component 126 has a pair of shaft receivers 128 formed thereon. Each of the shaft receivers 128 is a plate-like component having formed therein a through hole 142 into which a leg rotating shaft 141 is inserted. The shaft receivers 128 each act as a shaft receiver for supporting the leg rotating shaft 141 so as to allow the leg rotating shaft 141 to be rotatable on the hole surfaces of the through holes 142. The pair of shaft receivers 128 project from an inner wall of the second component 126. In the casing 123, the pair of shaft receivers 128 act as wall surfaces of the leg recess 124. The second component 126 is formed by a material having a strength greater than that of the first component 125.

Further, as shown in FIG. 11, in the second component 126, the sectioning wall 129 for sectioning the leg recess 124 is formed on the rear surface side of the casing 123. A latch portion 165 that projects toward the leg rotating shaft 141 in the leg recess 124 is formed in an inner side portion of the sectioning wall 129. The latch portion 165 also acts as a rotation prevention wall that engages with a leg projection 149 described below, when the leg component 140 has shifted from a short-leg state to a long-leg state as described below.

Subsequently, the leg component 140 will be described.

The leg component 140 is a component that acts as a leg for the electronic device 100. The leg component 140 is mounted to each of the first rotation mechanism 120a and the second rotation mechanism 120b as described above. The leg component 140 is formed by, for example, a material (for example, a rubber) having an elasticity.

As shown in FIG. 10, the leg component 140 is formed in a pillar-like shape having a uniform cross-sectional shape. The leg component 140 has a roughly egg-like cross-sectional shape as shown in FIG. 11. The leg component 140 has an intermediate portion 144 located in the mid-portion thereof in cross-section, a base end portion 145 located in one end side portion lateral to the intermediate portion 144 in cross-section, and a top end portion 146 located in the other end side portion lateral to the intermediate portion 144 in cross-section. The leg component 140 has a cross-sectional shape that is narrowed from the base end portion 145 toward the top end portion 146.

As shown in FIG. 10, the leg component 140 is mounted to the casing 123 through the leg rotating shaft 141 having both ends supported by the shaft receivers 128 of the casing 123. The leg component 140 is rotatable about the leg rotating shaft 141 relative to the casing 123. The leg component 140 is rotated on the leg rotating shaft 141, to switch between a short-leg state (a state shown in FIG. 11(a)) where the leg component 140 projects from the back surface 101b of the first casing 101 in the opened position, and a long-leg state (a state shown in FIG. 11(b)) where, in the opened position, the leg component 140 projects from the back surface 101b of the first casing 101 by a projecting length greater than that in the short-leg state.

The base end portion 145 is located on a base end side of the leg of the electronic device 100 in the long-leg state. In the leg component 140, a circular through hole 140a into which the leg rotating shaft 141 is inserted is formed on the base end portion 145 side. The through hole 140a is formed across side surfaces 140b of the leg component 140.

Further, as shown in FIG. 11, on the outer circumferential surface of the base end portion 145, a lock projection 147, a latch projection 148, and the leg projection 149 are formed. On the outer circumferential surface of the base end portion 145, the lock projection 147, the latch projection 148, and the leg projection 149 are disposed in order, respectively, in the counterclockwise direction shown in FIG. 11(a). A distance between the lock projection 147 and the latch projection 148 is greater than a distance between the latch projection 148 and the leg projection 149.

In a case where the left-right direction of the leg component 140 in FIG. 7 is the width direction of the leg component 140, the lock projection 147 and the latch projection 148 are elongated projections extending in the width direction. The lock projection 147 and the latch projection 148 have rounded tops. The lock projection 147 and the latch projection 148 have almost the same size.

In the short-leg state, the lock projection 147 engages with a lower wall 165a of the latch portion 165 at a position in the short-leg state as shown in FIG. 11(a). Further, when the short-leg state is switched to the long-leg state, the lock projection 147 is pressed by the latch portion 165 to reduce its projecting length, thereby passing by the latch portion 165.

Further, a portion between the latch projection 148 and the leg projection 149 acts as a latch receiver into which the latch portion 165 is fitted in the long-leg state as shown in FIG. 11(b). The distance between the latch projection 148 and the leg projection 149 is almost equal to a cross-sectional width of a top end surface of the latch portion 165.

Figure 15:
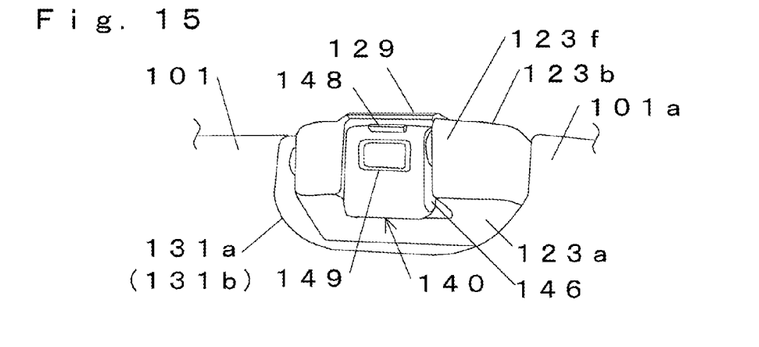
FIG. 15 is a perspective view of the leg component, as viewed from the top surface side of the first casing, in the case of the electronic device according to the embodiment being in the inverted position.

Further, the leg projection 149 is located on the top end portion side of the leg of the electronic device 100 in the short-leg state. As shown in FIG. 11, the leg projection 149 has a cross-sectional width that is greater than each of the lock projection 147 and the latch projection 148. A shape as viewed from the front of the leg projection 149 is roughly rectangular as shown in FIG. 15. On the outer circumferential surface of the leg component 140, the leg projection 149 is formed from the base end portion 145 through the intermediate portion 144. The top end face of the leg projection 149 is flat.

The top end portion 146 is located on the top end portion side of the leg of the electronic device 100 in the long-leg state. As shown in FIG. 11, the top end portion 146 has formed thereon a flat surface 146a that acts as the end face of the leg. In the top end portion 146, a first end side curved surface 146b that continuously connects to one side (the lower side in FIG. 11(a)) of the flat surface 146a has a curvature less than a second end side curved surface 146c that continuously connects to the other side (the upper side in FIG. 11(a)) of the flat surface 146a. A region in which the first end side curved surface 146b is formed corresponds to an exposed region that is exposed in the inverted position, and the second end side curved surface 146c corresponds to a non-exposed region that is not exposed in the inverted position.

[3. Function of Leg Component and the Like]

Firstly, a state where the leg component 140 is used as a leg for the electronic device 100 will be described.

Figure 12:
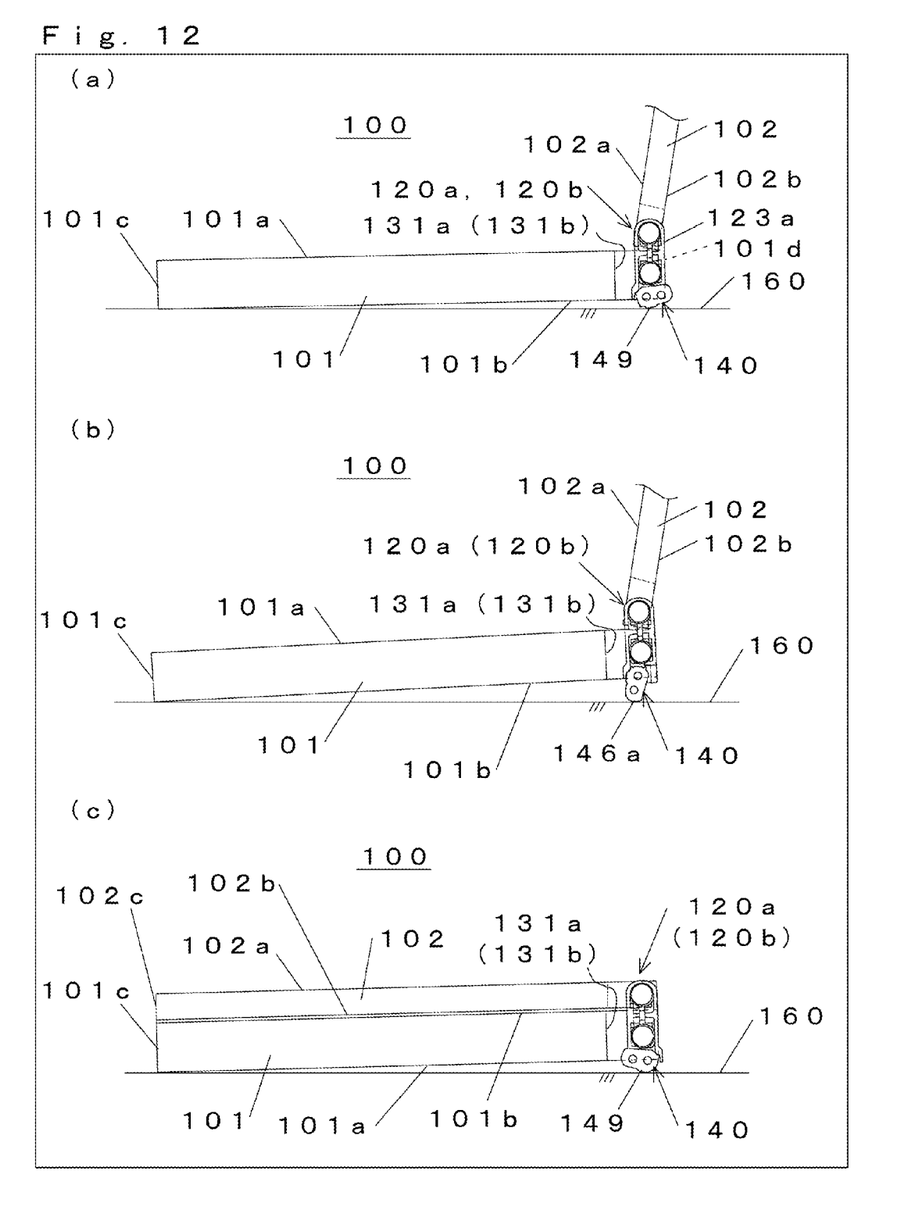
FIG. 12 illustrates a state where the electronic device according to the embodiment is placed on a setting surface.
Figure 13:
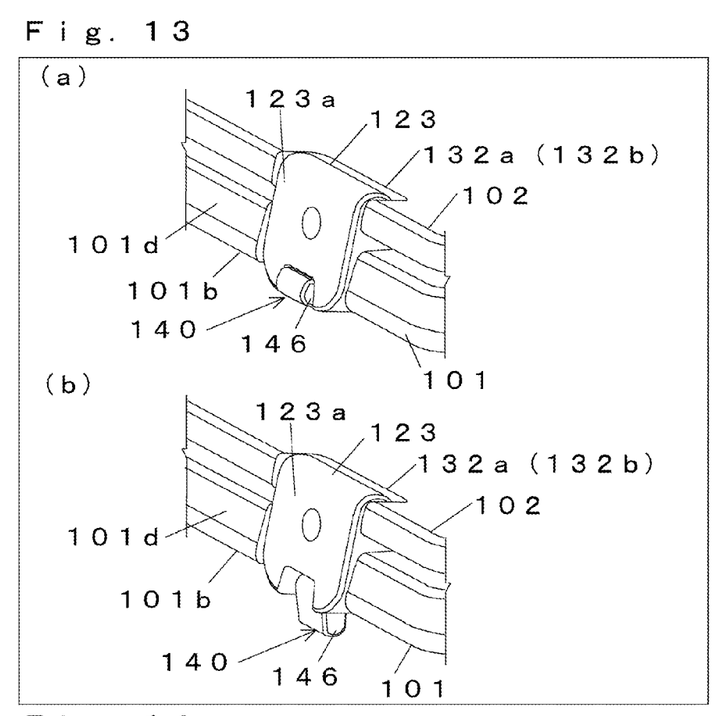
FIG. 13 is a perspective view of the leg component, as viewed from behind the first casing, in a case where the electronic device according to the embodiment is in the closed position.
Figure 14:
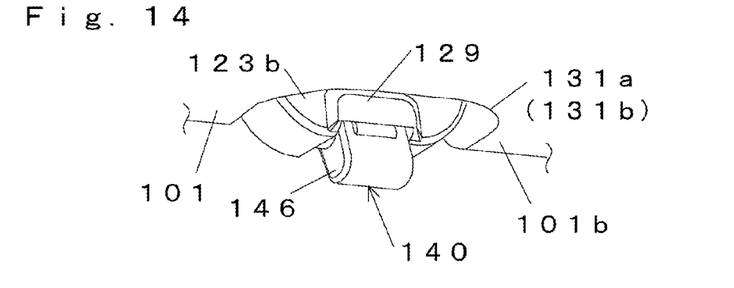
FIG. 14 is a perspective view of the leg component as viewed from the back of the first casing in a case where the electronic device according to the embodiment is in the closed position or the opened position.

FIG. 12 illustrates a state where the electronic device 100 according to the present embodiment is placed on a setting surface 160. FIG. 12(a) illustrates a case where the leg component 140 is in the short-leg state when the electronic device 100 is in the opened position. FIG. 12(b) illustrates a case where the leg component 140 is in the long-leg state when the electronic device 100 is in the opened position. FIG. 12(c) illustrates a case where the electronic device 100 is in the inverted position. FIG. 13 is a perspective view of the leg component 140 of the present embodiment, as viewed from behind the first casing 101. FIG. 13(a) illustrates the short-leg state, and FIG. 13(b) illustrates the long-leg state. FIG. 14 is a perspective view of the leg component 140 of the present embodiment as viewed from the back of the first casing 101. FIG. 15 is a perspective view of the leg component 140, as viewed from the top surface side of the first casing 101, in the case of the electronic device 100 according to the present embodiment being in the inverted position.

As shown in FIG. 12(a), in a case where the leg component 140 is in the short-leg state, the leg component 140 projects from the back surface 101b of the first casing 101. In this case, when the electronic device 100 is placed on the setting surface 160 such as a desk or the like, the leg component 140 acts as a rear leg for the electronic device 100, to tilt the top surface 101a of the first casing 101 toward the near side. In the leg component 140, the leg projection 149 abuts against the setting surface 160. Further, in a case where the leg component 140 is in the short-leg state, the top end portion 146 of the leg component 140 faces outward of each of the hinge recesses 131a and 131b of the first casing 101 as shown in FIG. 13(a). Further, as shown in FIG. 12(a), the top end portion 146 of the leg component 140 projects from the first principal surface 123a of the casing 123, and the top end portion 146 of the leg component 140 also projects from the rear side end face 101d of the first casing 101.

In a case where the electronic device 100 is in the closed position or the opened position, when the leg component 140 in the short-leg state is rotated on the leg rotating shaft 141 in the clockwise direction shown in FIG. 12(a), the lock projection 147 is pressed by the latch portion 165 and elastically deformed. The lock projection 147 has its projecting length reduced, to pass by the latch portion 165. Further, after the lock projection 147 passes by the latch portion 165, the latch projection 148 is pressed by the latch portion 165 and elastically deformed. The latch projection 148 has its projecting length reduced, to pass by the latch portion 165. At almost the same time when the latch projection 148 has passed by the latch portion 165, the outer circumferential surface of the leg projection 149 abuts against the latch portion 165, and the leg component 140 enters the long-leg state shown in FIG. 12(b), FIG. 13(b), and FIG. 14.

In a case where, when the leg component 140 is in the long-leg state, the electronic device 100 is placed on the setting surface 160 such as a desk or the like, the leg component 140 acts as a rear leg for the electronic device 100 to tilt the top surface 101a of the first casing 101 toward the near side, similarly to the short-leg state. In the leg component 140, the flat surface 146a of the top end portion 146 abuts against the setting surface 160. In the long-leg state, as shown in FIG. 12(b), a projecting length of the leg component 140 from the back surface 101b of the first casing 101 is greater than that in the short-leg state. Therefore, the top surface 101a of the first casing 101 is tilted more greatly toward the near side than in the short-leg state. Further, the leg component 140 in the long-leg state is tilted, toward the near side of the first casing 101, relative to the direction perpendicular to the back surface 101b of the first casing 101. In particular, in the long-leg state, in a case where the electronic device 100 is placed on the setting surface 160 that is horizontal by using the leg component 140 as the leg, the leg component 140 is tilted, toward the near side of the first casing 101, relative to the vertical direction. In the intermediate portion 144 of the leg component 140, a surface on the far side is tilted relative to the vertical direction more greatly than a surface on the near side.

Further, the leg component 140 is mounted movably to the rotation mechanisms 120a and 120b so as to rotate with the rotation mechanisms 120a and 120b. The leg component 140 rotates with the rotation mechanisms 120a and 120b when switching between the opened position and the inverted position is performed, and thus switching between a state where the leg component 140 projects from the back surface 101b of the first casing 101 in the opened position shown in FIG. 12(a), and a state where the leg component 140 projects from the top surface 101a of the first casing 101 in the inverted position. As shown in FIG. 12(c), in the inverted position, the leg component 140 at a position in the short-leg state projects from the top surface 101a of the first casing 101. Therefore, when the electronic device 100 is placed on the setting surface 160 such that the top surface 101a of the first casing 101 faces downward, the leg component 140 acts as the leg for the electronic device 100, to tilt the front surface 102a of the second casing 102 toward the near side. In the leg component 140, the leg projection 149 abuts against the setting surface 160. Further, when the leg component 140 is at a position in the short-leg state, the top end portion 146 of the leg component 140 faces an inside of each of the hinge recesses 131a and 131b of the first casing 101 as shown in FIG. 15.

Subsequently, a movement of the leg component 140 for switching from the opened position to the inverted position will be described.

Figure 16:
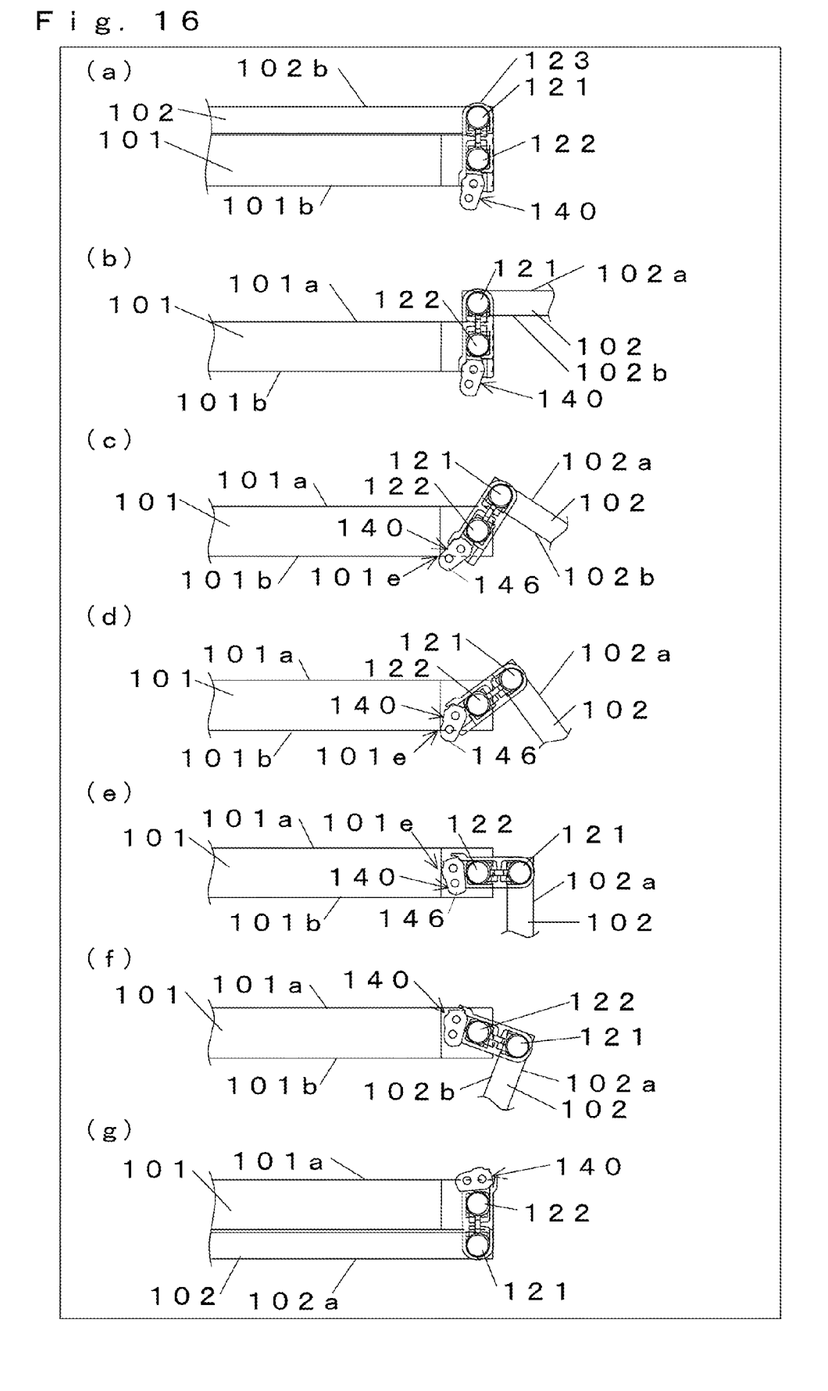
FIG. 16 is a cross-sectional view illustrating movements of a hinge mechanism and the leg component for switching the electronic device according to the embodiment from the closed position to the inverted position.

FIG. 16 is a cross-sectional view illustrating movements of the hinge mechanism 120 and the leg component 140 for switching the electronic device 100 according to the present embodiment from the closed position to the inverted position. FIG. 16(a) illustrates a case where the leg component 140 is in the long-leg state when the electronic device 100 is in the closed position. FIG. 16(b) illustrates a state where the second casing 102 is rotated about 180 degrees from the position shown in FIG. 16(a). FIG. 16(c) to FIG. 16(g) illustrate states where the second casing 102 is further rotated from the position shown in FIG. 16(b). In FIG. 16(g), the electronic device 100 is in the inverted position.

In FIG. 16(a), the leg component 140 is in the long-leg state. In this state, the first rotation shaft 121 and the second rotation shaft 122 are aligned in order, respectively, from the upper side, in the thickness direction of the electronic device 100. When, in this state, a user opens the electronic device 100 and presses the second casing 102 backward, the second casing 102 is rotated about the first rotation shaft 121, and enters a state shown in FIG. 16(b). In this state, the front surface 102a of the second casing 102 and the top surface 101a of the first casing 101 face in the same direction. While the state shown in FIG. 16(a) shifts to the state shown in FIG. 16(b), although the second casing 102 rotates, the rotation mechanisms 120a and 120b do not rotate.

When the user presses the second casing 102 downward in the state shown in FIG. 16(b), the second casing 102 is rotated about the second rotation shaft 122. While the state shown in FIG. 16(b) shifts to the state shown in FIG. 16(g), the rotation mechanisms 120a and 120b rotate with the second casing 102.

When the rotation mechanisms 120a and 120b enter a state shown in FIG. 16(c), the top end portion 146 of the leg component 140 abuts against an end portion 101c (specifically, a corner of the bottom surface of each of the hinge recesses 131a and 131b and a vicinity of the corner) on the far side of the first casing 101. When the second casing 102 is further rotated in this state, the leg component 140 is pressed by the first casing 101 and rotated, to move, through the position shown in FIG. 16(d), to a position in the short-leg state as shown in FIG. 16(e). While the state shown in FIG. 16(c) shifts to the state shown in FIG. 16(e), the leg component 140 is rotated counterclockwise. The end portion 101c, on the far side of the first casing 101, against which the top end portion 146 of the leg component 140 abuts, acts as a leg switching portion that switches the leg component 140 to a position in the short-leg state while the opened position is being switched to the inverted position in a case of the leg component 140 being in the long-leg state.

When the second casing 102 is further rotated in the state shown in FIG. 16(*e*), the electronic device 100 enters the inverted position as shown in FIG. 16(*f*) and FIG. 16(*g*). In the inverted position, the second rotation shaft 122 and the first rotation shaft 121 are aligned in order, respectively, from the upper side, in the thickness direction of the electronic device 100 in a state where the top surface 101*a* of the first casing 101 faces upward. While the state shown in FIG. 16(*c*) shifts to the state shown in FIG. 16(*g*), the rotation mechanisms 120*a* and 120*b* are rotated in a state where the leg component 140 is at a position in the short-leg state.

Further, for switching between the closed position and the state shown in FIG. 16(*b*), the second casing 102 is rotated about the first rotation shaft 121. For switching between the state shown in FIG. 16(*b*) and the inverted position, the second casing 102 is rotated about the second rotation shaft 122. In the state shown in FIG. 16(*b*), if the second casing 102 is pressed downward, the first rotation shaft 121 does not rotate. Further, in the state shown in FIG. 16(*b*), if the second casing 102 is pressed upward, the second rotation shaft 122 does not rotate.

[4. Effects and the Like]

In the present embodiment, the leg component 140 rotates with the hinge mechanism 120 when switching between the opened position and the inverted position is performed. Thus, switching between a state where the leg component 40 projects from the back surface 101*b* of the first casing 101 in the opened position, and a state where the leg component 140 projects from the top surface 101*a* of the first casing 101 in the inverted position, is performed. Therefore, the electronic device 100 that includes the useful leg component 140 which acts as a leg in the closed position, the opened position, and the inverted position, can be provided.

Further, in the present embodiment, the leg component 140 is mounted movably to the hinge mechanism 120 so as to switch between the short-leg state and the long-leg state. Therefore, in a case where the electronic device 100 is placed in the closed position or the opened position, a user is allowed to adjust a tilt of the top surface 101*a* of the first casing 101. Further, in the long-leg state, a distance from the setting surface 160 to the first casing 101 is increased. Therefore, a user is allowed to easily connect a subject to be connected with a connection terminal for an electrical cord and a connection port for a peripheral device on the outer circumferential surface of the first casing 101.

Further, in the present embodiment, the leg switching portion 101*e* is further provided which acts to switch the leg component 140 to a position in the short-leg state while the opened position is being switched to the inverted position in the case of the leg component 140 being in the long-leg state. The leg switching portion 101*c* is an end portion on the far side of the first casing 101. The leg switching portion 101*e* abuts against the leg component 140 that rotates with the hinge mechanism 120 to move the leg component 140 while the opened position is being switched to the inverted position, thereby switching the leg component 140 to a position in the short-leg state. In a case where the leg component 140 is at a position in the long-leg state in the case of the electronic device 100 being in the inverted position, when a user lifts and uses the electronic device 100, the user may be hindered by the leg component 140. According to the present embodiment, a user can be prevented from being hindered by the leg component 140 in the inverted position without expending effort for restoring the leg component 140 to the short-leg state in the case of the electronic device 100 being switched to the inverted position.

Further, in the present embodiment, in the inverted position, the leg component 140 at a position in the short-leg state projects from the top surface 101*a* of the first casing 101. Therefore, in a case where a user places the electronic device 100 on the setting surface 160 so as to face the display 103 upward in the inverted position, contact of the operation sections 110 with the setting surface 160 can be prevented. Further, a gap is generated between the setting surface 160 and the electronic device 100 that is placed in the inverted position, and thus a user can easily lift the electronic device 100 from the setting surface 160.

Further, in the present embodiment, in the hinge mechanism 120, the leg rotating shaft 141 is provided which supports the leg component 140 so as to enable the leg component 140 to rotate. The leg component 140 is rotated on the leg rotating shaft 141 to switch between the short-leg state and the long-leg state. Therefore, a user is allowed to adjust a tilt of the top surface 101*a* of the first casing 101 by merely pressing and rotating the leg component 140.

Further, in the present embodiment, when the leg component 140 in the long-leg state is rotated on the leg rotating shaft 141 outward of the first casing 101, to switch to the short-leg state, the top end portion 146 of the leg component 140 which is located on the top end side in the long-leg state projects from the rear side end face 101*d* of the first casing 101 in the short-leg state. Therefore, a user is allowed to easily put a finger on the top end portion 146 of the leg component 140 in the short-leg state. Thus, the user is allowed to easily switch the leg component 140 to the long-leg state.

Moreover, in the present embodiment, the hinge recesses 131*a* and 131*b* in which the hinge mechanism 120 is disposed are formed on the rear side end face 101*d* of the first casing 101. The top end portion 146 of the leg component 140 faces outward of the hinge recesses 131*a* and 131*b* in the opened position, and the top end portion 146 of the leg component 140 faces the inside of each of the hinge recesses 131*a* and 131*b* in the inverted position. Therefore, a user is not allowed to easily put a finger on the top end portion 146 of the leg component 140 in the inverted position, and the leg component 140 is less likely to switch to the long-leg state against the user's intention as compared to in the opened position. Further, in the top end portion 146 of the leg component 140, a curvature of the first end side curved surface 146*b* that is exposed in the inverted position is less than a curvature of the second end side curved surface 146*c* that is not exposed in the inverted position. Therefore, in the inverted position, an effect for preventing a user from easily putting a finger on the top end portion 146 of the leg component 140 can be further enhanced as compared to in the opened position.

Furthermore, in the present embodiment, the leg projection 149, which is the top end of the leg for the electronic device 100 in the short-leg state, is formed on the outer circumferential surface of the leg component 140. Therefore, the projecting length of the leg projection 149 is appropriately designed, to appropriately determine a tilt of the top surface 101*a* of the first casing 101 in the short-leg state.

Further, in the present embodiment, the electronic device 100 further includes the latch portion 165 that projects toward the leg rotating shaft 141. The latch projection 148 is formed on the outer circumferential surface of the leg component 140 so as to form, between the latch projection 148 and the leg projection 149, a latch receiver into which the latch portion 165 is fitted in the long-leg state. Since the latch portion 165 is fitted into the latch receiver, if restoration of the leg component 140 to the short-leg state is attempted, a relatively great force needs to be applied to restore the leg component 140 to the short-leg state. Therefore, even if a user draws the electronic device 100 toward the near side in the case of the electronic device 100 being placed on the setting surface 160 in the long-leg state shown in FIG. 12(b), the leg component 140 is less likely to be tilted outward due to a friction between the setting surface 160 and the top end portion 146 of the leg component 140.

Further, in the present embodiment, the lock projection 147 that engages with the latch portion 165 at a position in the short-leg state is formed on the outer circumferential surface of the leg component 140. When the short-leg state is switched to the long-leg state, the lock projection 147 is pressed by the latch portion 165 to reduce its projecting length, thereby passing by the latch portion. Therefore, while switching from the short-leg state to the long-leg state is not prevented, the leg component 140 in the short-leg state is less likely to rotate against the user's intention. Further, the top surface of the leg component 140 shown in FIG. 11(a) abuts against the wall surface of the leg recess 124. Therefore, in the short-leg state, the leg component 140 is less likely to be unstable, thereby stably supporting the electronic device 100.

Further, in the present embodiment, the cross-sectional width of the leg projection 149 is greater than the cross-sectional width of the latch projection 148. Therefore, the leg component 140 needs to be rotated with a considerably great force in order to allow the leg projection 149 to pass by the latch portion 165. Therefore, the leg component 140 can be prevented from rotating beyond a position in the long-leg state.

Further, in the present embodiment, the electronic device 100 further includes the rotation prevention wall 165a that engages with the leg projection 149 when the leg component 140 has shifted from the short-leg state to the long-leg state. Therefore, the leg component 140 is less likely to rotate beyond a position in the long-leg state.

Further, in the present embodiment, the leg component 140 in the long-leg state is tilted, toward the near side of the first casing 101, relative to the direction perpendicular to the back surface 101b of the first casing 101. In particular, in the long-leg state, in a case where the electronic device 100 is placed on the setting surface 160 that is horizontal by using the leg component 140 as the leg, the leg component 140 is tilted, toward the near side of the first casing 101, relative to the vertical direction. Therefore, the leg component 140 is less likely to be tilted toward the far side in the long-leg state. Therefore, in a case where the electronic device 100 is drawn toward the near side, the leg component 140 is less likely to be tilted due to a friction between the setting surface 160 and the top end portion 146 of the leg component 140.

Further, in the present embodiment, the hinge mechanism 120 includes the casings 123 each formed by two components of the first component 125 and the second component 126 being assembled. In each casing 123, only the second component 126, among the first component 125 and the second component 126, has the shaft receivers 128 for the leg rotating shaft 141. Therefore, if, for example, a load is applied in the up-down direction of the casing 123, to separate the first component 125 and the second component 126 from each other, the leg component 140 can be prevented from being removed from the casing 123.

Further, in the present embodiment, in each casing 123 including the first component 125 and the second component 126, a strength of the second component 126 having the shaft receivers 128 is higher than a strength of the first component 125. When the electronic device 100 is placed, a load is applied from below the electronic device 100, through the leg component 140, to the second component 126. A load applied to the second component 126 may be higher than a load applied to the first component 125. Therefore, even in a case where a relatively high load is applied to the second component 126, the second component 126 is less likely to be damaged.

Other Embodiments

As described above, the exemplary embodiment has been described above as examples of the technology disclosed in the present application. However, the technology according to the present disclosure is not limited to the exemplary embodiment, and is also applicable to other embodiments implemented by modifications, replacements, additions, omissions, or the like as appropriate. Furthermore, another exemplary embodiment can be implemented by combining the components described above for the exemplary embodiment.

Hereinafter, other exemplary embodiments will be described.

In the embodiment described above, a notebook computer is described as an example of the electronic device 100. However, the electronic device 100 may be, for example, foldable mobile telephone terminals, foldable electronic game machines, and foldable electronic dictionary terminals. The electronic device may be a device that includes the hinge mechanism 120 that allows switching from the closed position through the opened position to the inverted position.

Further, in the embodiment described above, the leg component 140 is mounted to the hinge mechanism 120. However, the leg component 140 may be mounted to another component that is integrated with the hinge mechanism 120.

Further, in the embodiment described above, the leg component 140 is rotated to switch between the short-leg state and the long-leg state. However, the leg component 140 may be slid in a predetermined direction, to switch between the short-leg state and the long-leg state.

Further, in the embodiment described above, the wall surface of the first casing 101 is described as an example of the leg switching portion 101c. However, the leg switching portion 101e is not limited thereto. The leg switching portion 101e may switch a position of the leg component 140 by, for example, a power from a motor.

Further, in the embodiment described above, in the inverted position, the leg component 140 at a position in the short-leg state projects from the top surface 101a of the first casing 101. However, the leg component 140 may project from the top surface 101a of the first casing 101 not when the leg component 140 is at a position in the short leg state, but when the leg component 140 is at a position in the long-leg state.

Further, in the embodiment described above, the leg rotating shaft 141 extends along the far side of the first casing 101. However, the direction in which the leg rotating shaft 141 extends is not limited thereto. The leg rotating shaft 141 may extend along the front-rear direction of the first casing 101.

As presented above, one embodiment has been described as an example of the technology according to the present disclosure. For this purpose, the accompanying drawings and the detailed description are provided.

Therefore, components in the accompanying drawings and the detail description may include not only components essential for solving problems, but also components that are provided to illustrate the above described technology and are not essential for solving problems. Therefore, such inessential components should not be readily construed as being essential based on the fact that such inessential components are shown in the accompanying drawings or mentioned in the detailed description.

Further, the above described embodiment has been described to exemplify the technology according to the present disclosure, and therefore, various modifications, replacements, additions, and omissions may be made within the scope of the claims and the scope of the equivalents thereof.

What is claimed is:

1. An electronic device, comprising:
a first casing having an operation section on a top surface;
a second casing having a display on a front surface;
a hinge mechanism configured to connect the first casing to the second casing, the hinge mechanism configured to rotate the second casing, relative to the first casing, on a connection portion in which the first casing is connected to the second casing, to allow the electronic device to switch from a closed position where the front surface of the second casing overlaps the top surface of the first casing, through an opened position where the second casing is raised relative to the first casing, to an inverted position where a back surface of the second casing overlaps a back surface of the first casing, the hinge mechanism configured to rotate according to the second casing being rotated when switching between the opened position and the inverted position is performed; and
a leg component configured to act as a leg for the electronic device, to rotate with the hinge mechanism when switching between the opened position and the inverted position is performed, and to switch, by rotating with the hinge mechanism, between a state where the leg component projects from the back surface of the first casing in the opened position, and a state where the leg component projects from the top surface of the first casing in the inverted position,
wherein the leg component is mounted movably to the hinge mechanism such that the leg component switches between a short-leg state where the leg component projects from the back surface of the first casing in the opened position, and a long-leg state where the leg component projects from the back surface of the first casing in the opened position by a projecting length greater than that in the short-leg state,
wherein the electronic device further comprises a leg switching portion configured to switch, when the leg component is in the long-leg state, the leg component to a position in the short-leg state while the opened position is being switched to the inverted position, and
wherein the leg switching portion is an end portion on a far side of the first casing, and the leg switching portion is configured to abut against the leg component that rotates with the hinge mechanism and move the leg component, to switch the leg component to a position in the short-leg state, while the opened position is being switched to the inverted position.

2. The electronic device according to claim 1, wherein, in the inverted position, the leg component projects from the top surface of the first casing at a position in the short-leg state.

3. The electronic device according to claim 1, wherein the hinge mechanism includes a leg rotating shaft that supports the leg component such that the leg component is rotatable, and
the leg component is rotated on the leg rotating shaft, to switch between the short-leg state and the long-leg state.

4. The electronic device according to claim 3, wherein, when the leg component in the long-leg state is rotated on the leg rotating shaft outward of the first casing, to switch to the short-leg state, a top end portion of the leg component located on a top end side in the long-leg state projects from an outer circumferential surface on a far side of the first casing in the short-leg state.

5. The electronic device according to claim 3, wherein
a hinge recess in which the hinge mechanism is disposed is formed on an outer circumferential surface on a far side of the first casing, and
in a case where a portion of the leg component located on a top end side in the long-leg state is a top end portion, when the leg component is at a position in the short-leg state, the top end portion faces outward of the hinge recess in the opened position, and the top end portion of the leg component faces an inside of the hinge recess in the inverted position.

6. The electronic device according to claim 5, wherein
in the top end portion of the leg component, a curvature of an exposed region that is exposed in the inverted position is less than a curvature of a non-exposed region that is not exposed in the inverted position.

7. The electronic device according to claim 3, wherein a leg projection is formed, on an outer circumferential surface of the leg component, so as to act as an end portion of a leg for the electronic device in the short-leg state.

8. The electronic device according to claim 7, further comprising a latch portion that projects toward the leg rotating shaft, wherein
a latch projection is formed on the outer circumferential surface of the leg component such that a latch receiver into which the latch portion is fitted in the long-leg state is formed between the latch projection and the leg projection.

9. The electronic device according to claim 8, wherein
a lock projection that engages with the latch portion at a position in the short-leg state is formed on the outer circumferential surface of the leg component, and
the lock projection is pressed by the latch portion and has a projecting length reduced, to pass by the latch portion, when the short-leg state is switched to the long-leg state.

10. The electronic device according to claim 8, wherein the leg projection has a cross-sectional width greater than the latch projection.

11. The electronic device according to claim 7, further comprising a rotation prevention wall that engages with the leg projection when the leg component has shifted from the short-leg state to the long-leg state.

12. The electronic device according to claim 1, wherein the leg component in the long-leg state is tilted, toward a near side of the first casing, relative to a direction perpendicular to the back surface of the first casing.

13. The electronic device according to claim 1, wherein the leg component in the long-leg state is tilted toward a near side of the first casing, relative to a vertical direction when the electronic device is placed on a horizontal plane by using the leg component as a leg.

14. The electronic device according to claim 3, wherein
the hinge mechanism includes a casing formed by a plurality of components being assembled, and
a shaft receiver for the leg rotating shaft is provided in only one of the plurality of components, in the casing.

15. The electronic device according to claim 14, wherein, in the casing, a strength of one of the plurality of components in which the shaft receiver is provided is greater than strengths of the others of the plurality of components.

16. The electronic device according to claim 1, wherein
the hinge mechanism includes a rotation shaft that allows the second casing to rotate relative to the first casing when switching between the closed position and the inverted position is performed, and
the leg component is provided in an exterior component that is a box-shaped component in which the rotation shaft of the hinge mechanism is provided.

17. The electronic device according to claim 16, wherein
the hinge mechanism includes a first rotation shaft and a second rotation shaft as the rotation shaft,
the electronic device switches from the closed position to the inverted position, through a first shift state where the second casing is rotated relative to the first casing on the first rotation shaft, and a second shift state, immediately following the first shift state, where the second casing is rotated relative to the first casing on the second rotation shaft, and
the exterior component is a box-shaped component in which the first rotation shaft and the second rotation shaft are provided.

18. The electronic device according to claim 17, wherein
the first shift state includes a state where the operation section of the first casing and the display of the second casing face each other at an angle less than 180 degrees, and
the second shift state includes a state where the operation section of the first casing and the display of the second casing form an angle greater than 180 degrees.

19. An electronic device, comprising:
a first casing having an operation section on a top surface;
a second casing having a display on a front surface;
a hinge mechanism configured to connect the first casing to the second casing, the hinge mechanism configured to rotate the second casing, relative to the first casing, on a connection portion in which the first casing is connected to the second casing, to allow the electronic device to switch from a closed position where the front surface of the second casing overlaps the top surface of the first casing, through an opened position where the second casing is raised relative to the first casing, to an inverted position where a back surface of the second casing overlaps a back surface of the first casing, the hinge mechanism configured to rotate according to the second casing being rotated when switching between the opened position and the inverted position is performed; and
a leg component configured to act as a leg for the electronic device, to rotate with the hinge mechanism when switching between the opened position and the inverted position is performed, and to switch, by rotating with the hinge mechanism, between a state where the leg component projects from the back surface of the first casing in the opened position, and a state where the leg component projects from the top surface of the first casing in the inverted position,
wherein the leg component is mounted movably to the hinge mechanism such that the leg component switches between a short-leg state where the leg component projects from the back surface of the first casing in the opened position, and a long-leg state where the leg component projects from the back surface of the first casing in the opened position by a projecting length greater than that in the short-leg state,
wherein the hinge mechanism includes a leg rotating shaft that supports the leg component such that the leg component is rotatable,
wherein a leg projection is formed, on an outer circumferential surface of the leg component, so as to act as an end portion of a leg for the electronic device in the short-leg state,
wherein the electronic device further comprises a latch portion that projects toward the leg rotating shaft, and
wherein a latch projection is formed on the outer circumferential surface of the leg component such that a latch receiver into which the latch portion is fitted in the long-leg state is formed between the latch projection and the leg projection.

20. The electronic device according to claim 19, wherein the leg component is rotated on the leg rotating shaft, to switch between the short-leg state and the long-leg state.

21. The electronic device according to claim 19, wherein, in the inverted position, the leg component projects from the top surface of the first casing at a position in the short-leg state.

22. The electronic device according to claim 20, wherein, when the leg component in the long-leg state is rotated on the leg rotating shaft outward of the first casing, to switch to the short-leg state, a top end portion of the leg component located on a top end side in the long-leg state projects from an outer circumferential surface on a far side of the first casing in the short-leg state.

23. The electronic device according to claim 20, wherein
a hinge recess in which the hinge mechanism is disposed is formed on an outer circumferential surface on a far side of the first casing, and
in a case where a portion of the leg component located on a top end side in the long-leg state is a top end portion, when the leg component is at a position in the short-leg state, the top end portion faces outward of the hinge recess in the opened position, and the top end portion of the leg component faces an inside of the hinge recess in the inverted position.

24. The electronic device according to claim 19, wherein
a lock projection that engages with the latch portion at a position in the short-leg state is formed on the outer circumferential surface of the leg component, and
the lock projection is pressed by the latch portion and has a projecting length reduced, to pass by the latch portion, when the short-leg state is switched to the long-leg state.

25. The electronic device according to claim 19, wherein the leg projection has a cross-sectional width greater than the latch projection.

26. The electronic device according to claim 19, further comprising a rotation prevention wall that engages with the leg projection when the leg component has shifted from the short-leg state to the long-leg state.

27. The electronic device according to claim 19, wherein the leg component in the long-leg state is tilted, toward a near side of the first casing, relative to a direction perpendicular to the back surface of the first casing.

28. The electronic device according to claim 19, wherein the leg component in the long-leg state is tilted toward a near side of the first casing, relative to a vertical direction when the electronic device is placed on a horizontal plane by using the leg component as a leg.

29. The electronic device according to claim 20, wherein
the hinge mechanism includes a casing formed by a plurality of components being assembled, and
a shaft receiver for the leg rotating shaft is provided in only one of the plurality of components, in the casing.

30. The electronic device according to claim 19, wherein
the hinge mechanism includes a rotation shaft that allows the second casing to rotate relative to the first casing when switching between the closed position and the inverted position is performed, and the leg component is provided in an exterior component that is a box-shaped component in which the rotation shaft of the hinge mechanism is provided.

31. The electronic device according to claim 23, wherein in the top end portion of the leg component, a curvature of an exposed region that is exposed in the inverted position is less than a curvature of a non-exposed region that is not exposed in the inverted position.

32. The electronic device according to claim 29, wherein, in the casing, a strength of one of the plurality of components in which the shaft receiver is provided is greater than strengths of the others of the plurality of components.

33. The electronic device according to claim 30, wherein the hinge mechanism includes a first rotation shaft and a second rotation shaft as the rotation shaft, the electronic device switches from the closed position to the inverted position, through a first shift state where the second casing is rotated relative to the first casing on the first rotation shaft, and a second shift state, immediately following the first shift state, where the second casing is rotated relative to the first casing on the second rotation shaft, and the exterior component is a box-shaped component in which the first rotation shaft and the second rotation shaft are provided.

34. The electronic device according to claim 33, wherein the first shift state includes a state where the operation section of the first casing and the display of the second casing face each other at an angle less than 180 degrees, and the second shift state includes a state where the operation section of the first casing and the display of the second casing form an angle greater than 180 degrees.

* * * * *